(12) United States Patent
Okamoto

(10) Patent No.: US 8,314,649 B1
(45) Date of Patent: Nov. 20, 2012

(54) SEMICONDUCTOR APPARATUS

(75) Inventor: Toshiharu Okamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/595,483

(22) Filed: Aug. 27, 2012

Related U.S. Application Data

(63) Continuation of application No. 12/774,370, filed on May 5, 2010, now Pat. No. 8,283,969.

(30) Foreign Application Priority Data

Jun. 25, 2009 (JP) .................. 2009-151059

(51) Int. Cl.
*G05F 1/10* (2006.01)

(52) U.S. Cl. ...................................... 327/541; 327/536

(58) Field of Classification Search .................. 327/534, 327/535, 536, 538, 540, 541, 543
See application file for complete search history.

(56) References Cited

U.S. PATENT DOCUMENTS 4,439,692 A 3/1984 Beekmans et al.
6,169,444 B1 1/2001 Thurber
6,229,379 B1 5/2001 Okamoto
6,281,716 B1 8/2001 Mihara
7,692,477 B1 4/2010 Chen

FOREIGN PATENT DOCUMENTS

JP 11-150230 6/1999
JP 2003-173213 6/2003

*Primary Examiner* — Jeffrey Zweizig
(74) *Attorney, Agent, or Firm* — Young & Thompson

(57) ABSTRACT

Provided is a semiconductor apparatus including a divided voltage generation circuit that includes a first resistor element and a first transistor connected in series between a first power supply and a second power supply and generates a divided voltage by dividing a voltage difference between the first power supply and the second power supply with a resistance ratio of the first resistor element and the first transistor specified according to a level of a first current flowing to the first transistor, and a current control circuit that includes a second transistor that is connected in a mirror configuration to the first transistor and determines the level of the first current by a control current flowing from a first terminal to a second terminal, and increases and decreases the control current according to an increase and decrease in a voltage difference between the first power supply and a ground power supply.

7 Claims, 10 Drawing Sheets

SEMICONDUCTOR APPARATUS

CROSS REFERENCE TO RELATED APPLICATIONS

This application is a continuation of co-pending application Ser. No. 12/774,370 filed on May 5, 2010, which claims foreign priority to Japanese Application No. 2009-151059 filed on Jun. 25, 2009. The entire content of each of these applications is hereby expressly incorporated by reference.

BACKGROUND

1. Field of the Invention

The present invention relates to a semiconductor apparatus and, particularly, to a semiconductor apparatus including a voltage divider that generates a divided voltage by dividing a voltage difference between a first power supply and a second power supply.

2. Description of Related Art

As a recent trend, a semiconductor apparatus generates a voltage different from a power supply voltage inside the apparatus and makes an internal circuit operate with the generated voltage in order to improve the performance. An example of such a voltage is a bias voltage (or a reference voltage). The bias voltage is a voltage that serves as a reference of a circuit operation and it is required to maintain a stable voltage without depending on variations of a power supply voltage. An example of a bias voltage generator is disclosed in Japanese Unexamined Patent Application Publication No. 2003-173213.

FIG. 15 shows a block diagram of a bias voltage generator 100 disclosed in Japanese Unexamined Patent Application Publication No. 2003-173213. Referring to FIG. 15, the bias voltage generator 100 includes a resistor element R40, an output transistor NT40, and a current control circuit 140. The resistor element R40 and the output transistor NT40 are connected in series between a power supply VCC and a power supply VSS. In the bias voltage generator 100, a node between the resistor element R40 and the output transistor NT40 serves as an output node N10. A gate and a drain of the output transistor NT40 are connected to each other. The current control circuit 140 includes a resistor element R41 and transistors NT41 and NT42. The current control circuit 140 is placed in parallel with the output transistor NT40. The current control circuit 140 increases a current I12 that flows from the output node N10 to the power supply VSS as the voltage of the power supply VCC increases. The bias voltage generator 100 can thereby allow the value of a bias voltage VBS that is output from the output node N10 to remain substantially constant or decrease with respect to an increase in the voltage of the power supply VCC.

However, in the bias voltage generator 100, a voltage level that serves as a reference of the bias voltage VBS is determined by a threshold voltage (or a diode voltage) of the output transistor NT40 with respect to the power supply VSS. Some semiconductor apparatus generates a negative voltage inside the apparatus and uses it for a circuit in the apparatus in order to improve the performance. In the case of using the bias voltage generator 100 in such a case, the bias voltage VBS varies with variations of the negative voltage, and therefore the bias voltage generator 100 cannot be used for a circuit in which both the power supply VCC and the power supply VSS vary.

DRAM (Dynamic Random Access Memory) is one of such semiconductor apparatus using a negative voltage. In DRAM, a negative voltage is generated for a substrate voltage VBB and used as a substrate voltage of a transistor of a memory cell. By using the negative voltage as the substrate voltage VBB, it is possible in the DRAM to reduce a leakage current of the memory cell and improve data storage capability (cf. "Very LSI Memory" written by Kiyoo Itoh and published from Baihukan). The negative voltage is generated typically by a charge pump. An example of a negative voltage generator that generates a negative voltage with use of a charge pump is disclosed in Japanese Unexamined Patent Application Publication No. 11-150230.

FIG. 16 shows a block diagram of a negative voltage generator 200 disclosed in Japanese Unexamined Patent Application Publication No. 11-150230. Referring to FIG. 16, the negative voltage generator 200 includes a reference voltage generator 210, a voltage divider 220, a comparator 230, an oscillator 240, a clock buffer 250, and a negative voltage charge pump 260. The reference voltage generator 210 generates a constant voltage having a voltage value between a power supply voltage and a ground voltage and outputs it as a reference voltage 201. The voltage divider 220 divides a voltage between the reference voltage 201 and a negative voltage 204 and outputs it as a divided voltage 202. In the voltage divider 220, a voltage dividing ratio is set in such a way that the divided voltage 202 becomes a ground voltage when the negative voltage 204 reaches a voltage value to be set. The comparator 230 compares a voltage value of the divided voltage 202 with the ground voltage, and if the voltage value of the divided voltage 202 is higher than the ground voltage, it activates an oscillator control signal 203, and if the voltage value of the divided voltage 202 is lower than the ground voltage, it inactivates the oscillator control signal 203. The oscillator 240 outputs a first oscillator output signal 205 and a second oscillator output signal 206 having opposite phases when the oscillator control signal 203 is activated. The clock buffer 250 outputs a first complementary pulse signal 207 corresponding to the first oscillator output signal 205, and outputs a second complementary pulse signal 208 corresponding to the second oscillator output signal 206. The negative voltage charge pump 260 outputs the negative voltage 204 based on the first complementary pulse signal 207 and the second complementary pulse signal 208.

The negative voltage generator 200 has a circuit configuration in which, when the negative voltage 204 reaches a preset voltage, the divided voltage 202 becomes the ground voltage that is input as a comparative voltage of the comparator 230. In the negative voltage generator 200, the reference voltage generator 210 generates the reference voltage 201 that is not dependent on variations of the power supply voltage VCC in order to stably obtain the negative voltage 204 even when the power supply voltage VCC varies. Further, the voltage divider 220 determines a voltage dividing ratio between the reference voltage 201 and the negative voltage 204 by a resistor string. Specifically, in the negative voltage generator 200, the divided voltage 202 that reflects the voltage value of the negative voltage 204 is generated based on the stable reference voltage 201 and a fixed voltage dividing ratio. The negative voltage generator 200 can thereby stabilize the voltage value of the negative voltage 204 regardless of the power supply voltage VCC.

SUMMARY

However, in the negative voltage generator 200 disclosed in Japanese Unexamined Patent Application Publication No. 11-150230, it is necessary that the reference voltage generator 210 generates the reference voltage 201 with high accuracy. In order to generate the accurate reference voltage 201, the circuit size of the reference voltage generator 210 becomes larger. Therefore, the negative voltage generator 200 disclosed in Japanese Unexamined Patent Application Publication No. 11-150230 has a problem that the circuit size is large.

A first exemplary aspect of the present invention is a semiconductor apparatus which includes a divided voltage generation circuit that includes a first resistor element and a first transistor connected in series between a first power supply and a second power supply and generates a divided voltage by dividing a voltage difference between a voltage of the first power supply and a voltage of the second power supply based on a resistance ratio of the first resistor element and the first transistor specified according to a level of a first current flowing to the first transistor; and a current control circuit that includes a second transistor that is connected in a mirror configuration to the first transistor and determines the level of the first current by a control current flowing from a first terminal to a second terminal of the second transistor, and increases and decreases the control current according to an increase and decrease in a voltage difference between the first power supply and a ground power supply.

A second exemplary aspect of the present invention is a semiconductor apparatus which includes a divided voltage generation circuit that includes a first resistor element and a first transistor connected in series between a first power supply and a second power supply and generates a divided voltage by dividing a voltage difference between a voltage of the first power supply and a voltage of the second power supply based on a resistance ratio of the first resistor element and the first transistor specified according to a level of a first current flowing to the first transistor, and a current control circuit that includes a second transistor that is connected in a mirror configuration to the first transistor and determines the level of the first current by a control current flowing from a drain terminal to a source terminal of the second transistor, and increases and decreases the control current according to an increase and decrease in a voltage difference between the first power supply and a ground power supply, wherein the current control circuit includes a circuit that includes a resistor group of at least one resistor element connected in series and a third transistor with a drain terminal and a gate terminal short-circuited connected in series between the first power supply and the ground power supply and outputs a power supply detection voltage that increases and decreases according to an increase and decrease in the voltage of the first power supply from any one of a node between resistors of the resistor group and a node between a resistor of the resistor group and the third transistor, and a third resistor element that is placed between a node outputting the power supply detection voltage and the second transistor and sets a level of the control current, and the second transistor has the source terminal connected to the second power supply and has the drain terminal and a gate terminal short-circuited.

A third exemplary aspect of the present invention is a semiconductor apparatus that generates a second power supply based on a first power supply and a ground power supply, which includes a divided voltage generation circuit that includes a first resistor element and a first transistor connected in series between the first power supply and the second power supply and generates a divided voltage by dividing a voltage difference between a voltage of the first power supply and a voltage of the second power supply based on a resistance ratio of the first resistor element and the first transistor specified according to a level of a first current flowing to the first transistor, a current control circuit that includes a second transistor that is connected in a mirror configuration to the first transistor and determines the level of the first current by a control current flowing from a first terminal to a second terminal of the second transistor, and increases and decreases the control current according to an increase and decrease in a voltage difference between the first power supply and a ground power supply, and a voltage control circuit that controls the voltage of the second power supply to a target voltage determined by the voltage of the first power supply and the resistance ratio based on the divided voltage.

A fourth exemplary aspect of the present invention is a semiconductor apparatus which includes a divided voltage generation circuit that includes a resistor element and an element with a resistance value varying according to a control current, and outputs a third voltage (e.g. a divided voltage VDIV) by dividing a first voltage (e.g. a voltage of a power supply VCC) being a positive voltage and a second voltage (e.g. a voltage of a negative voltage VNEG) being a negative voltage, and a current control circuit that outputs the control current to the divided voltage generation circuit based on a voltage difference between the first voltage and a ground voltage, wherein the current control circuit reduces variations of the third voltage due to variations of the first voltage by increasing the control current when the first voltage rises and decreasing the control current when the first voltage drops.

In the semiconductor apparatus according to the exemplary aspects of the present invention described above, the control current according to the amount of variations of the first power supply is generated by the current control circuit, and a resistance value of the first transistor is varied based on the control current. The resistance ratio of the first resistor element and the first transistor is thereby varied according to the variations of the first power supply in the divided voltage generation circuit. Therefore, in the semiconductor apparatus according to the exemplary aspects of the present invention, the divided voltage generation circuit can generate the divided voltage that reflects the voltage value of the second power supply without depending on the variations of the first power supply. Further, in the semiconductor apparatus according to the exemplary aspects of the present invention, it is possible to reduce the circuit size because there is no need to generate a reference voltage with high accuracy.

In the semiconductor apparatus according to the exemplary aspects of the present invention, it is possible to generate the divided voltage that reflects the voltage level of the second power supply with high accuracy as well as reducing the circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
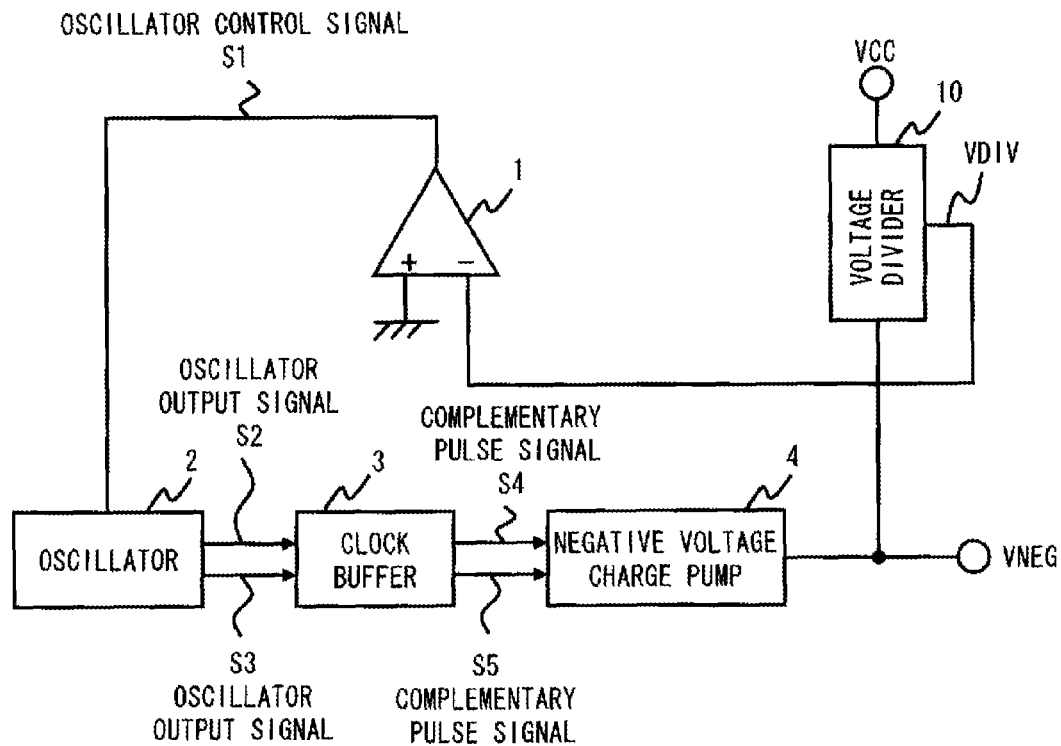
FIG. 1 is a block diagram of a voltage generator according to a first exemplary embodiment.

An exemplary embodiment of the present invention is described hereinafter with reference to the drawings. FIG. 1 shows a block diagram of a voltage generator according to a first exemplary embodiment. Referring to FIG. 1, the voltage generator according to the first exemplary embodiment is a voltage generator that generates a second power supply based on a first power supply (e.g. a power supply VCC) and a ground power supply. The voltage generator according to the first exemplary embodiment includes a voltage divider 10, a comparator 1, an oscillator 2, a clock buffer 3 and a negative voltage charge pump 4. In this exemplary embodiment, a voltage control circuit is made up of the comparator 1, the oscillator 2, the clock buffer 3 and the negative voltage charge pump 4. The voltage control circuit controls a voltage value of the second power supply (e.g. a negative voltage VNEG) to a target voltage that is determined by a resistance ratio of resistor elements included in the voltage divider and the power supply VCC based on a divided voltage VDIV output from the voltage divider 10.

The voltage divider 10 generates the divided voltage VDIV by dividing the power supply VCC and the negative voltage VNEG according to the resistance ratio of the resistor elements included therein. A voltage dividing ratio of the voltage divider 10 is set in such a way that the divided voltage VDIV becomes a reference voltage (a ground voltage in this exemplary embodiment) input to the comparator 1 when the negative voltage VNEG reaches a voltage value to be set (a target voltage). The detail of the voltage divider 10 is described later.

The reference voltage (e.g. the ground voltage) is input to a non-inverting terminal of the comparator 1, and the divided voltage VDIV is input to an inverting terminal of the comparator 1. Then, the comparator 1 compares the voltage value of the divided voltage VDIV with the ground voltage, and if the voltage value of the divided voltage VDIV is higher than the ground voltage, it activates an oscillator control signal S1, and if the voltage value of the divided voltage VDIV is lower than the ground voltage, it inactivates the oscillator control signal S1.

When the oscillator control signal S1 is activated, the oscillator 2 outputs a first oscillator output signal S2 and a second oscillator output signal S3 having opposite phases. The clock buffer 3 outputs a first complementary pulse signal S4 corresponding to the first oscillator output signal S2, and outputs a second complementary pulse signal S5 corresponding to the second oscillator output signal S3. The negative voltage charge pump 4 outputs the negative voltage VNEG based on the first complementary pulse signal S4 and the second complementary pulse signal S5.

Figure 2:
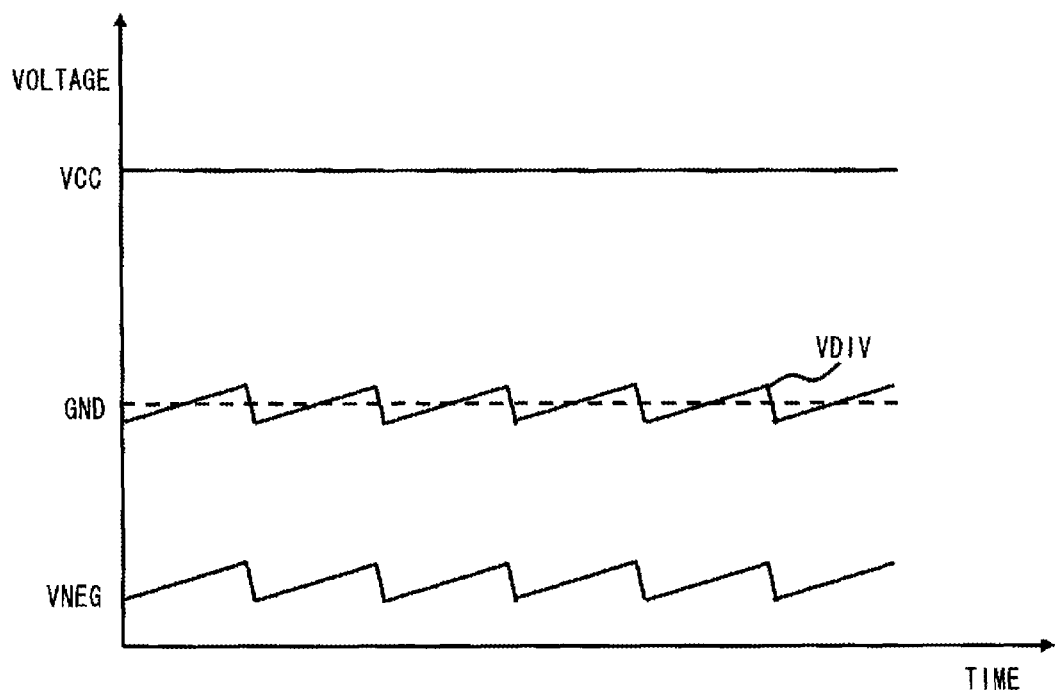
FIG. 2 is a graph showing a negative voltage generating operation of the voltage generator according to the first exemplary embodiment.

A negative voltage generating operation of the voltage generator according to the first exemplary embodiment is described hereinbelow. FIG. 2 shows a graph showing an operation of the voltage generator according to the first exemplary embodiment. In the graph shown in FIG. 2, the horizontal axis indicates time, and the vertical axis indicates voltages of the power supply VCC, the ground voltage GND, the divided voltage VDIV and the negative voltage VNEG. As shown in FIG. 2, in the voltage generator according to the first exemplary embodiment, the divided voltage VDIV becomes the ground voltage GND when the negative voltage VNEG reaches the target voltage. The negative voltage VNEG is generated by the negative voltage charge pump 4, and, because the negative voltage VNEG is supplied to another circuit (e.g. a substrate voltage of DRAM), the negative voltage VNEG has characteristics that it rises unless the negative voltage charge pump 4 operates.

In light of that, in the voltage generator according to the first exemplary embodiment, the voltage divider 10 generates the divided voltage VDIV by dividing the voltage of the power supply VCC and the negative voltage VNEG. Therefore, if the voltage of the power supply VCC is constant, the divided voltage VDIV varies depending on variations of the negative voltage VNEG. Thus, in the voltage generator according to the first exemplary embodiment, variations of the negative voltage VNEG are detected based on the divided voltage VDIV, and if the negative voltage VNEG becomes higher than the target voltage, the negative voltage charge pump 4 is enabled to thereby let the negative voltage VNEG drop. On the other hand, if the negative voltage VNEG becomes lower than the target voltage, the negative voltage charge pump 4 is stopped to thereby prevent the negative voltage VNEG from dropping. In this manner, in the voltage generator according to the first exemplary embodiment, the negative voltage VNEG is maintained to be a voltage close to the target voltage. Note that in the operation example shown in FIG. 2, variations of the negative voltage VNEG and the divided voltage VDIV are exaggerated for the purpose of explaining the variations.

Although the power supply VCC is constant in the above-described operation example, the power supply VCC actually varies with noise or increasing and decreasing current consumption. Therefore, when the resistance ratio of the resistor elements in the voltage divider 10 is constant, the divided voltage VDIV is affected by variations of the power supply VCC, which can make the voltage value of the negative voltage VNEG unstable. In light of this, in this exemplary embodiment, the voltage divider 10 has a mechanism for not varying the divided voltage VDIV with respect to variations of the power supply VCC. The detail of the voltage divider 10 is described hereinbelow.

Figure 3:
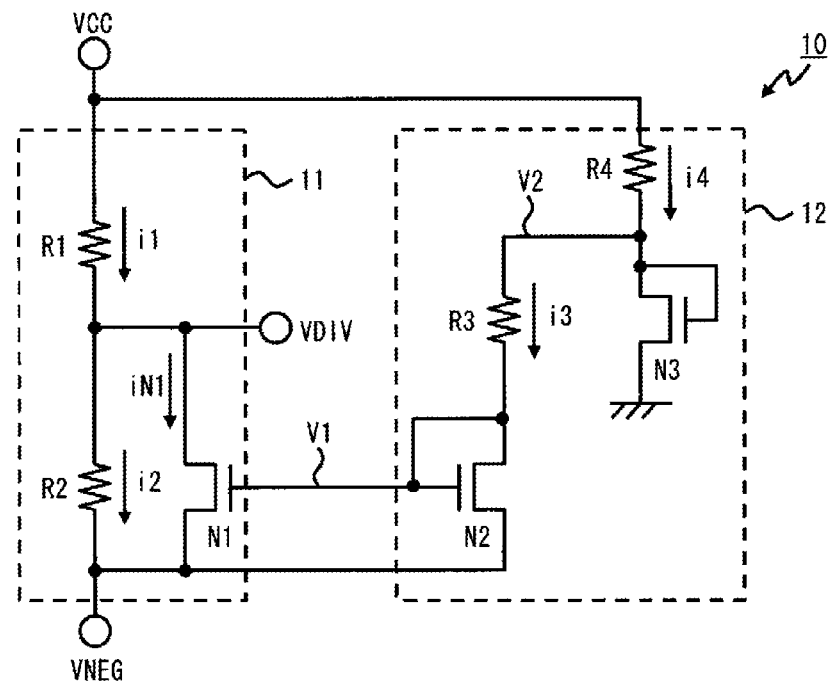
FIG. 3 is a circuit diagram of a voltage divider according to the first exemplary embodiment.

FIG. 3 shows a circuit diagram of the voltage divider 10. Referring to FIG. 3, the voltage divider 10 includes a divided voltage generation circuit 11 and a current control circuit 12. The divided voltage generation circuit 11 includes a first resistor element (e.g. a resistor R1), a fourth resistor element (e.g. a resistor R2), and a first transistor N1. It is assumed in this exemplary embodiment that the first transistor N1 is an NMOS transistor. The resistor R1 and the first transistor N1 are connected in series between a first power supply (e.g. the power supply VCC) and a second power supply (e.g. the negative voltage VNEG). Further, the resistor R2 is connected in parallel with the first transistor N1. The divided voltage generation circuit 11 generates the divided voltage VDIV by dividing a voltage difference between the voltage of the power supply VCC and the voltage of the negative voltage VNEG based on a resistance ratio of the resistor R1 and the first transistor N1 that is set according to the level of a first current iN1 flowing to the first transistor N1. Specifically, the divided voltage generation circuit 11 generates the divided voltage VDIV by dividing the power supply VCC and the negative voltage VNEG with the ratio of the combined resistance value of the resistance value of the resistor R2 and the resistance value of the first transistor N1 to the resistance value of the resistor R1.

The current control circuit 12 includes a second transistor N2, a third transistor N3, a voltage-current converter (e.g. a resistor R3), and a second resistor element (e.g. a resistor R4). In this exemplary embodiment, NMOS transistors are used as the second transistor N2 and the third transistor N3. The second transistor N2 is connected in a mirror configuration to the first transistor N1. Further, a control terminal (e.g. a gate) and a drain of the second transistor N2 are connected to each other. Thus, the second transistor N2 controls the level of the first current iN1 flowing to the first transistor N1 by a control current flowing from a first terminal (e.g. a drain) to a second terminal (e.g. a source). In the following description, a voltage that is generated at the gate of the second transistor N2 is referred to as a current control voltage V1.

A second terminal (e.g. a source) of the third transistor N3 is connected to the ground terminal, and a first terminal (e.g. a drain) of the third transistor N3 is connected to the power supply VCC through the resistor R4. Further, a control terminal (e.g. a gate) and a drain of the third transistor N3 are connected to each other. Specifically, the third transistor N3 functions as a diode and generates a power supply detection voltage V2 at its drain according to a current i4 that is input through the resistor R4. Thus, the current control circuit 12 has a circuit configuration in which a resistor group in which at least one resistor element is connected in series (the resistor R4 in this exemplary embodiment) and the third transistor N3 with the drain terminal and the gate terminal short-circuited are connected in series between the power supply VCC and the ground power supply, and the power supply detection voltage V2 that increases or decreases with an increase or decrease in the voltage of the power supply VCC is output from a node between the resistor R4 and the third transistor N3. Note that, in the case where the resistor group is composed of a plurality of resistors, as described in other exemplary embodiments below, the power supply detection voltage V2 may be output from any one of a node between the resistors of the resistor group and a node between one resistor of the resistor group and the third transistor.

The voltage-current converter generates a control current by converting a voltage difference between the power supply detection voltage V2 and the current control voltage V1 at the gate of the second transistor N2 into a current i3. In this exemplary embodiment, a third resistor element is used as the voltage-current converter. The third resistor element is represented as the resistor R3 in FIG. 3. Specifically, the resistor R3 is placed between the node that outputs the power supply detection voltage V2 and the second transistor N2 and sets the level of the control current.

Thus, when the power supply VCC varies, the current control circuit 12 converts the amount of variations into a current as the current i4 and varies the power supply detection voltage V2 that is generated at the drain of the third transistor N3 according to the variations of the current i4. The variations of the power supply detection voltage V2 occur because a voltage Vds between the source and the drain of the third transistor N3 varies with variations of a current flowing between the source and the drain of the third transistor N3. On the other hand, a threshold voltage Vtn2 of the second transistor N2 is constant because it is not affected by variations of the power supply VCC. Therefore, by the variations of the power supply detection voltage V2, a difference between voltages generated at the both ends of the resistor R3 varies, and the current i3 (i.e. the control current) thereby varies. In this manner, the current control circuit 12 increases or decreases the control current according to an increase or decrease in a voltage difference between the power supply VCC and the ground power supply.

Further, in the current control circuit 12, because the second transistor N2 and the third transistor N3 are transistors of the same polarity, even in the occurrence of threshold fluctuations of transistors, voltage variations of the power supply VCC can be reflected on variations of the control current at a constant sensitivity regardless of the threshold fluctuations. This is because, in the case of using transistors of the same polarity, the effect of fluctuations is exerted equally on a threshold Vtn2 of the second transistor N2 and a threshold Vtn3 of the third transistor N3, and a difference between voltages generated at the both ends of the resistor R3 is a relative value of those thresholds, and thus the fluctuations of the thresholds of the two transistors are cancelled out with each other. Further, it is preferred that the second transistor N2 and the third transistor N3 have substantially the same temperature characteristics. If the temperature characteristics are the same, variations of the sensitivity due to the ambient temperature and the semiconductor substrate temperature can be reduced. In order to obtain this advantage, it is preferred that the second transistor N2 and the third transistor N3 are manufactured through the same process (ion implantation step). To be exact, it is preferred that the second transistor N2 and the third transistor N3 are manufactured through the same step. In the transistors that are formed through the same step, fluctuations of threshold voltages and temperature characteristics are substantially the same (for example, the ratio of the amount of fluctuations and the rate of change with a temperature change are substantially equal) while having different threshold voltages due to the gate length or the gate width of transistors. Further, because the first transistor N1 and the second transistor N2 form a current mirror, they preferably have the same polarity and are manufactured in the same process.

Figure 4:
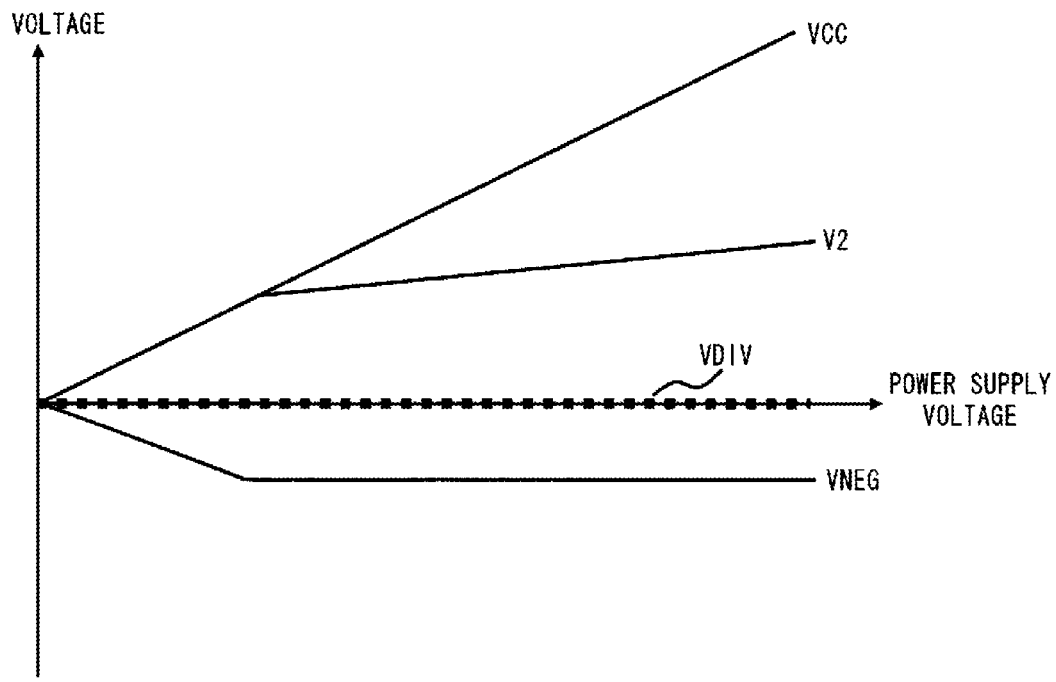
FIG. 4 is a graph showing power supply voltage characteristics of the voltage generator according to the first exemplary embodiment.

Power supply voltage characteristics of the voltage generator that includes the voltage divider 10 according to the first exemplary embodiment are described hereinbelow. FIG. 4 shows a graph of power supply voltage characteristics of the voltage generator according to the first exemplary embodiment. Referring to FIG. 4, the voltage generator according to the first exemplary embodiment generates the negative voltage VNEG having a constant voltage value regardless of the value of the power supply VCC when the power supply VCC becomes equal to or higher than a predetermined voltage (a voltage with which the voltage generator is operable). Such power supply voltage characteristics are based on the operation of the voltage divider 10.

In the voltage divider 10, the power supply detection voltage V2 rises when the voltage of the power supply VCC rises. With the rise of the power supply detection voltage V2, the control current (current i3) increases. Because the first transistor N1 and the second transistor N2 form a current mirror, the first current iN1 increases with the increase in the control current. The resistance value of the first transistor N1 thereby decreases, and the combined resistance value of the first transistor N1 and the resistor R2 decreases accordingly. On the other hand, when the power supply VCC drops, the power supply detection voltage V2 drops. With the drop of the power supply detection voltage V2, the control current (current i3) decreases. Because the first transistor N1 and the second transistor N2 form a current mirror, the first current iN1 decreases with the decrease in the control current. The resistance value of the first transistor N1 thereby increases, and the combined resistance value of the first transistor N1 and the resistor R2 increases accordingly.

Thus, in the voltage divider 10, the resistance ratio of the resistor R1 to the combined resistance of the first transistor N1 and the resistor R2 is variable according to variations of the power supply VCC, thereby maintaining the divided voltage VDIV at the ground voltage with respect to the constant negative voltage VNEG.

Further, in the voltage divider 10, when the negative voltage VNEG rises, the voltage value of the current control voltage V1 rises, and thus a difference between voltages at the both ends of resistor R3 decreases. Therefore, the control current (current i3) decreases. By the decrease in the control current, the first current iN1 increases, so that the resistance value of the first transistor N1 increases, and the combined resistance of the resistor R2 and the first transistor N1 increases accordingly. Thus, when the negative voltage VNEG rises, the divided voltage VDIV rises by the rise of the negative voltage VNEG and the increase in the combined resistance of the resistor R2 and the first transistor N1. With the rise of the divided voltage VDIV, the comparator 1 activates the oscillator control signal S1, and the negative voltage charge pump 4 thereby starts operating and drops the negative voltage VNEG.

On the other hand, when the negative voltage VNEG drops, the voltage value of the current control voltage V1 drops, and thus a difference between voltages at the both ends of the resistor R3 increases. Therefore, the control current (current i3) increases. By the increase in the control current, the first current iN1 decreases, so that the resistance value of the first transistor N1 decreases, and the combined resistance of the resistor R2 and the first transistor N1 decreases accordingly. Thus, when the negative voltage VNEG drops, the divided voltage VDIV drops by the drop of the negative voltage VNEG and the decrease in the combined resistance of the resistor R2 and the first transistor N1. Then, when the negative voltage VNEG falls below a targert voltage, the divided voltage VDIV also falls below the ground voltage, and thus the comparator 1 inactivates the oscillator control signal S1, and the negative voltage charge pump 4 thereby stops operating. The negative voltage VNEG then rises because a current flows from the voltage divider 10 and another circuit.

Figure 5:
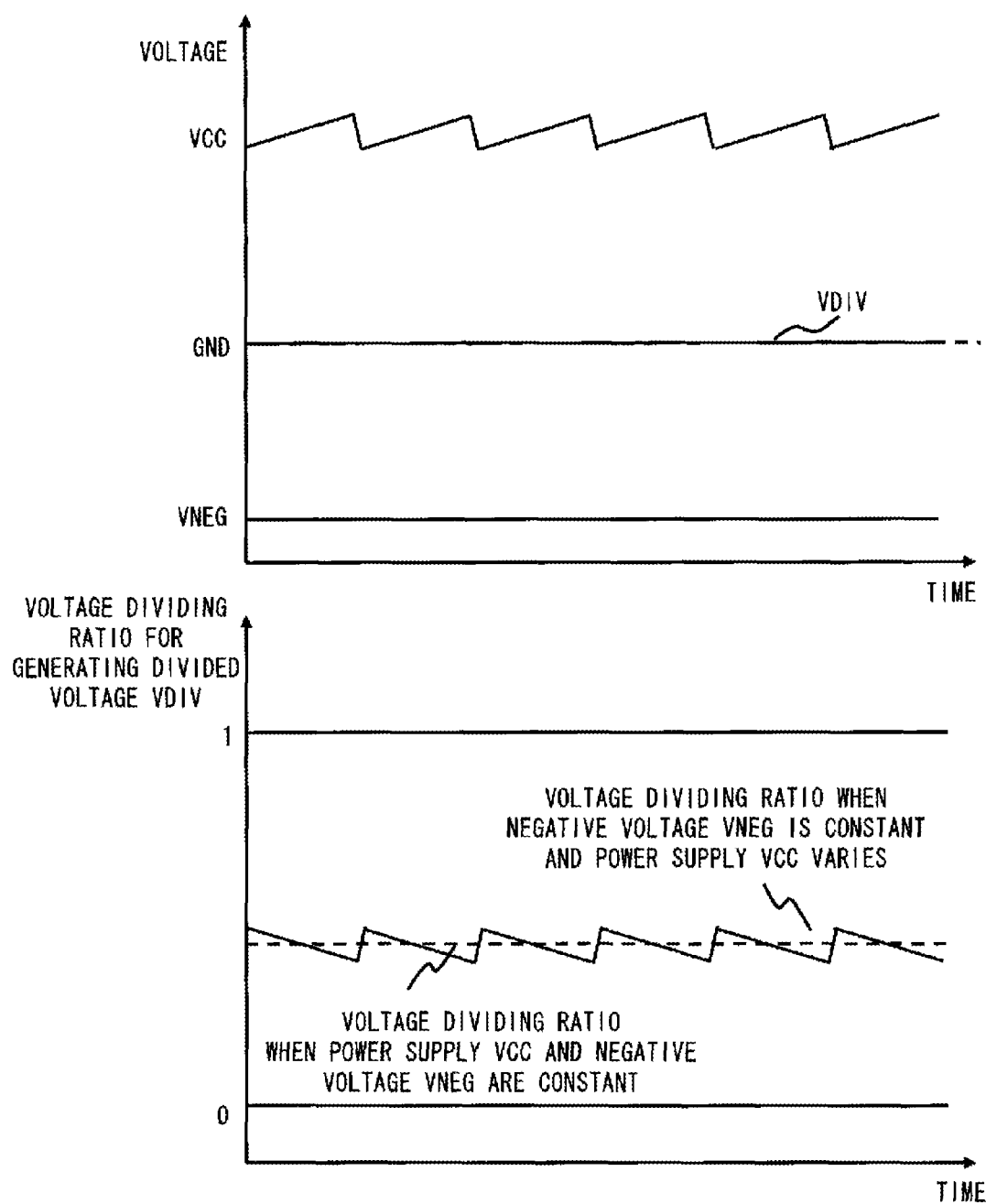
FIG. 5 is a graph showing variation characteristics of a voltage dividing ratio of the voltage divider with respect to variations of a power supply voltage according to the first exemplary embodiment.

As described above, in the voltage divider 10 according to the first exemplary embodiment, a voltage dividing ratio that is determined by the first resistor R1 and the combined resistance of the resistor R2 and the first transistor N1 is varied according to variations of the power supply VCC. FIG. 5 shows a graph of variation characteristics of the voltage dividing ratio with respect to variations of the power supply VCC. Referring to FIG. 5, in the voltage divider 10, the voltage dividing ratio is set lower when the power supply VCC rises, and the voltage dividing ratio is set higher when the power supply VCC drops. In this manner, by varying the voltage dividing ratio according to variations of the power supply VCC, the voltage divider 10 can maintain the value of the divided voltage VDIV constant with respect to the negative voltage VNEG having a constant voltage value.

As described above, in the voltage generator according to the first exemplary embodiment, the current control circuit 12 of the voltage divider 10 increases or decreases the control current according to voltage variations of the power supply VCC. Then, the first current iN1 flowing to the first transistor N1 is increased or decreased according to the increase or decrease in the control current by the current mirror formed by the first transistor N1 and the second transistor N2, thereby changing the resistance ratio of the resistor R1 to the combined resistance of the first transistor N1 and the resistor R2. It is therefore possible in the voltage generator according to the first exemplary embodiment to maintain the value of the divided voltage VDIV constant with respect to the constant value of the negative voltage VNEG regardless of the voltage of the power supply VCC. Thus, in the voltage generator according to the first exemplary embodiment, it is possible to maintain the voltage level of the negative voltage VNEG with high accuracy against variations of the power supply VCC.

The negative voltage VNEG that is generated in the voltage generator according to the first exemplary embodiment is represented by the following expression (1). In the expression (1), R2a is the combined resistance value of the resistor R2 and the first transistor N1, R1 is the resistance value of the resistor R1, and VCC is the voltage value of the power supply VCC.

$$VNEG = -(R2a/R1) \times VCC \qquad \text{Expression 1}$$

Thus, the voltage divider 10 according to the first exemplary embodiment operates to decrease the resistance value of the combined resistance R2a when the voltage of the power supply VCC rises and to increase the resistance value of the combined resistance R2a when the voltage of the power supply VCC drops, thereby reducing voltage variations of the negative voltage VNEG upon variations of the voltage of the power supply VCC.

Further, in the voltage divider 10, the control current is determined based on a relative level of the current control voltage V1 generated at the control terminal of the second transistor N2 and the power supply detection voltage V2 generated at the drain of the third transistor N3. The voltage values of the current control voltage V1 and the power supply detection voltage V2 are determined by the threshold voltage of the transistors. Therefore, if the second transistor N2 and the third transistor N3 have the same polarity and are manufactured in the same process, fluctuations of the threshold generated in the manufacturing process are substantially the same between the second transistor N2 and the third transistor N3. Therefore, in the voltage divider 10, the effect of the threshold of the transistors does not appear in the level of the control current. In the bias voltage generator 100 disclosed in Japanese Unexamined Patent Application Publication No. 2003-173213, when the output transistor NT40 and the transistors NT41 and NT42 have different amounts of fluctuations of the threshold voltage, the bias voltage VBS cannot be maintained constant due to the fluctuations. Thus, in the bias voltage generator 100 disclosed in Japanese Unexamined Patent Application Publication No. 2003-173213, the accuracy of the output voltage is lower than that of the voltage divider 10 according to the first exemplary embodiment.

In the voltage divider 10, the size (e.g. the gate length or the gate width) of the third transistor N3 is preferably different from that of the second transistor N2 in the case of setting a predetermined current value as the minimum current level of the control current. The third transistor N3 and the second transistor N2 can thereby generate different voltages at their drains with respect to the same current level.

Second Exemplary Embodiment

Figure 6:
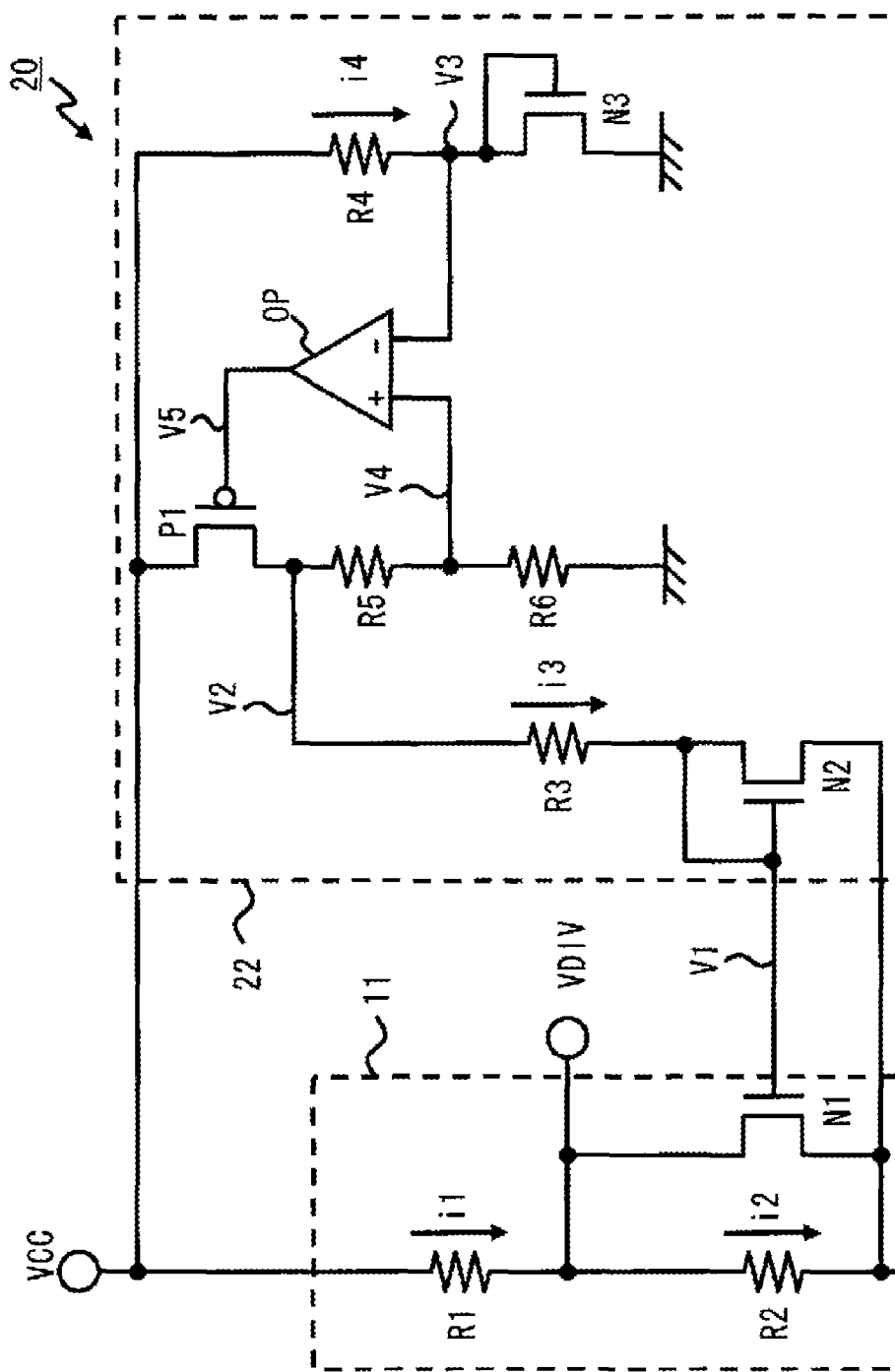
FIG. 6 is a circuit diagram of a voltage divider according to a second exemplary embodiment.

A voltage divider 20, which is an alternative example of the voltage divider 10, is described hereinafter as a second exemplary embodiment. FIG. 6 shows a circuit diagram of the voltage divider 20. Referring to FIG. 6, the voltage divider 20 includes a current control circuit 22 in place of the current control circuit 12.

In the current control circuit 22, a first power supply detection voltage V3 that is generated at the drain of the third transistor N3 is amplified by an amplifier to generate a second power supply detection voltage V2. The second power supply detection voltage V2 corresponds to the power supply detection voltage V2 in the first exemplary embodiment.

The amplifier of the current control circuit 22 is made up of a differential amplifier OP, resistors R5 and R6, and a PMOS transistor P1. A source of the PMOS transistor P1 is connected to the power supply VCC, and a drain of the PMOS transistor P1 is connected to the resistor R5. The resistor R5 is connected to the ground terminal through the resistor R6. A non-inverting input terminal of the differential amplifier OP is connected to a node between the resistor R5 and the resistor R6, and an inverting input terminal of the differential amplifier OP is connected to the drain of the third transistor N3. The differential amplifier OP amplifies a voltage difference between voltages input to the inverting input terminal and the non-inverting input terminal and outputs a control signal V5. The control signal V5 is input to a gate of the PMOS transistor P1. Further, in the amplifier of the current control circuit 22, the second power supply detection voltage V2 is output from a drain of the PMOS transistor P1.

Thus, the current control circuit 22 generates the control current based on the voltage difference between the second power supply detection voltage V2 generated by amplifying the first power supply detection voltage V3 at the drain of the third transistor N3 and the current control voltage V1.

Figure 7:
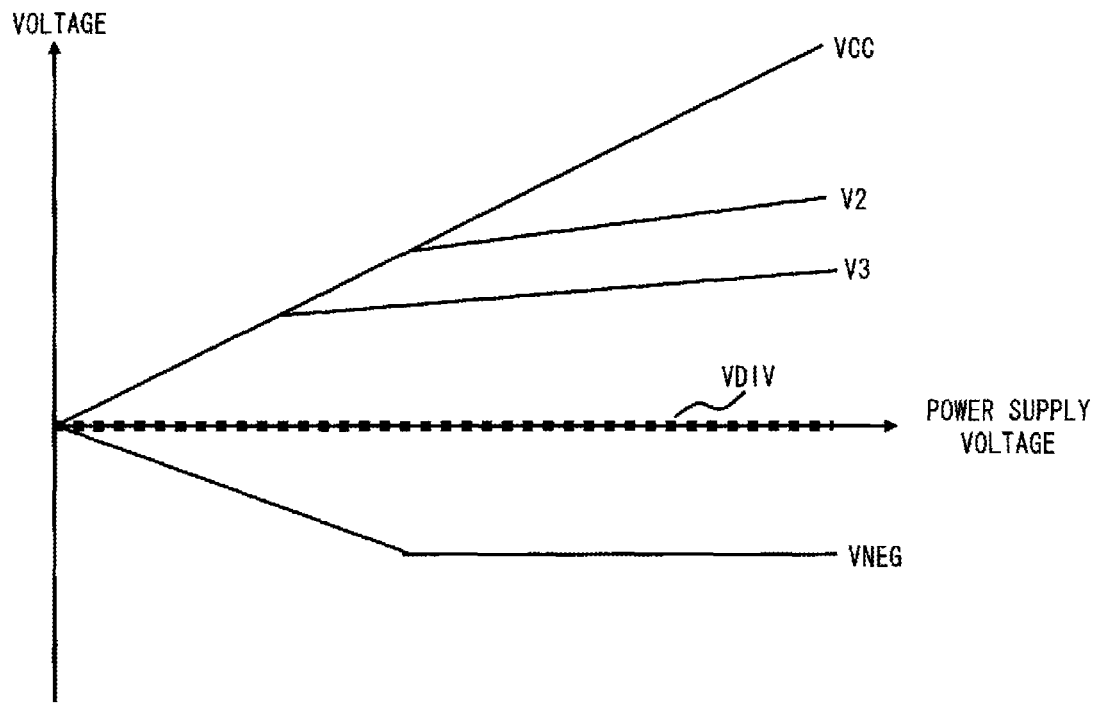
FIG. 7 is a graph showing power supply voltage characteristics of a voltage generator according to the second exemplary embodiment.

FIG. 7 shows a graph of power supply voltage characteristics of a voltage generator in the case of using the voltage divider 20. Referring to FIG. 7, in the voltage generator according to the second exemplary embodiment, the second power supply detection voltage V2 having a higher voltage value than the first power supply detection voltage V3 is generated. The second power supply detection voltage V2 has a steeper gradient than the first power supply detection voltage V3. The difference in gradient is due to the gain of the amplifier of the current control circuit 22 (the gain determined by a resistance ratio of the resistors R5 and R6). In the voltage generator according to the second exemplary embodiment, the voltage of the negative voltage VNEG is maintained constant regardless of voltage variations of the power supply VCC according to the second power supply detection voltage V2.

As described above, in the voltage divider 20 according to the second exemplary embodiment, the gradient of the second power supply detection voltage V2 with respect to variations of the voltage of the power supply VCC can be adjusted by the amplifier of the current control circuit 22. Therefore, the voltage divider 20 according to the second exemplary embodiment can generate the divided voltage VDIV with higher accuracy than the voltage divider 10 according to the first exemplary embodiment. Further, based on the highly accurate divided voltage VDIV, the voltage generator according to the second exemplary embodiment can generate the negative voltage VNEG with higher accuracy than the voltage generator according to the first exemplary embodiment.

Third Exemplary Embodiment

Figure 8:
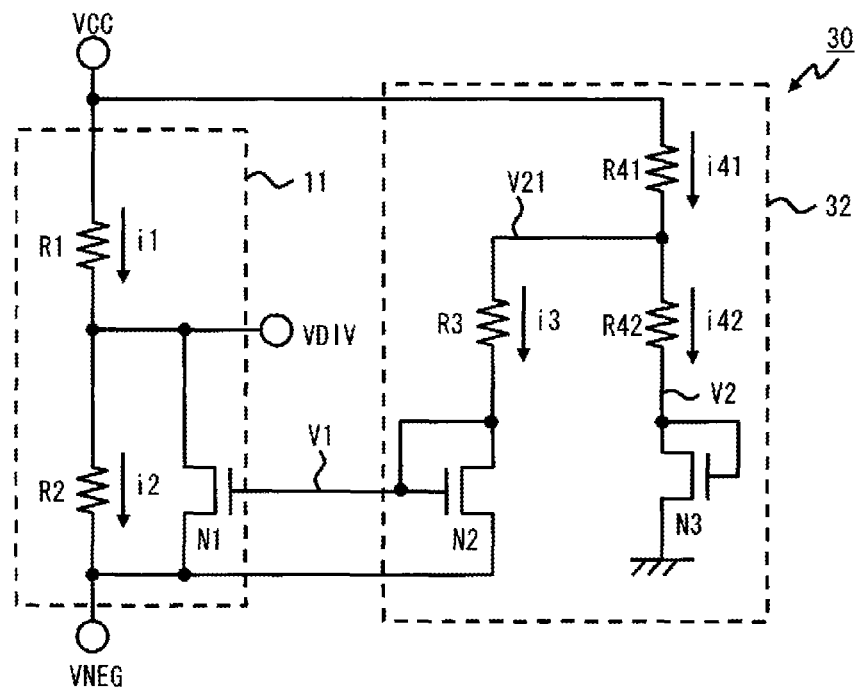
FIG. 8 is a circuit diagram of a voltage divider according to a third exemplary embodiment.

A voltage divider 30, which is an alternative example of the voltage divider 10, is described hereinafter as a third exemplary embodiment. FIG. 8 shows a circuit diagram of the voltage divider 30. Referring to FIG. 8, the voltage divider 30 includes a current control circuit 32 in place of the current control circuit 12.

In the current control circuit 32, the third resistor element of the current control circuit 12 (e.g. a resistor R42) is added. Further, a resistor corresponding to the resistor R4 is a resistor R41 in FIG. 8. The resistor R42 is placed between the resistor R41 and the drain of the third transistor N3. In the current control circuit 32, a power supply detection voltage V21 is output from a node between the resistor R41 and the resistor R42. The power supply detection voltage V21 is a voltage generated by dividing the power supply detection voltage V2 and the power supply VCC with a resistance ratio of the resistor R41 and the resistor R42.

The voltage divider 30 allows the current control circuit to have a desired power supply voltage dependence with a small difference in size between the second transistor N2 and the third transistor N3. If the sizes of the second transistor N2 and the third transistor N3 are largely different, there is a possibility that threshold fluctuation characteristics are different, and thus the power supply voltage dependence is added by using a resistance-divided voltage.

Figure 9:
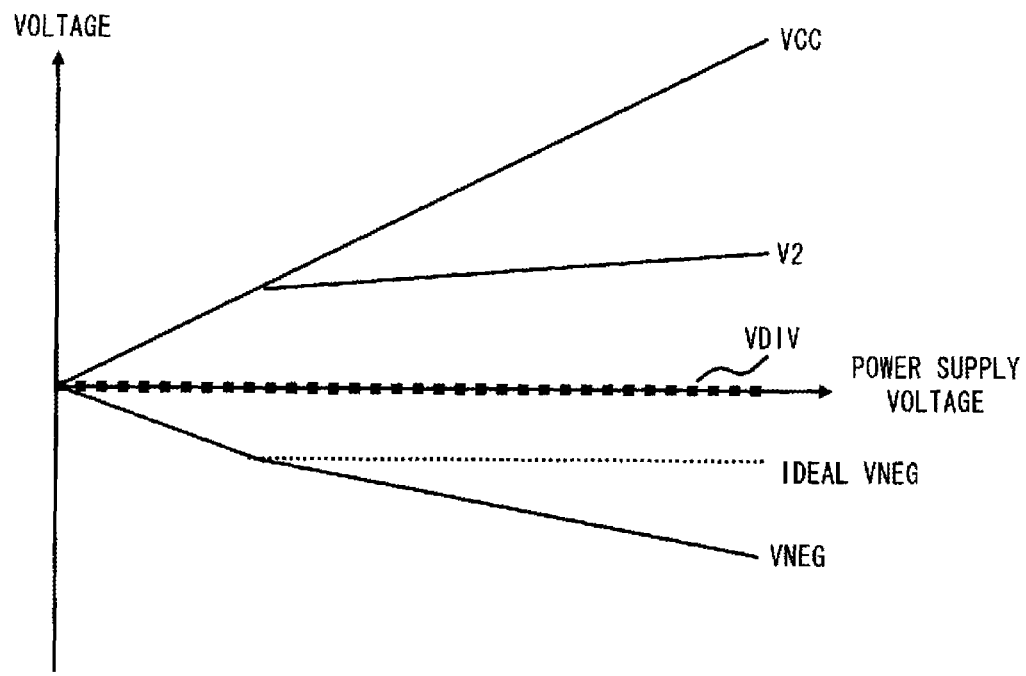
FIG. 9 is a graph showing power supply voltage characteristics when fluctuations occur in a threshold of a transistor in the voltage divider according to the first exemplary embodiment.

FIG. 9 shows a graph of power supply voltage characteristics of the voltage generator in the case where the sizes of the second transistor N2 and the third transistor N3 are largely different in the voltage divider 10 according to the first exemplary embodiment. As shown in FIG. 9, when the sizes of the second transistor N2 and the third transistor N3 are largely different, a problem that the negative voltage VNEG varies with variations of the power supply voltage occurs in the voltage generator according to the first exemplary embodiment. In FIG. 9, the case where the negative voltage VNEG falls below a desired control level is shown by way of illustration.

Figure 10:
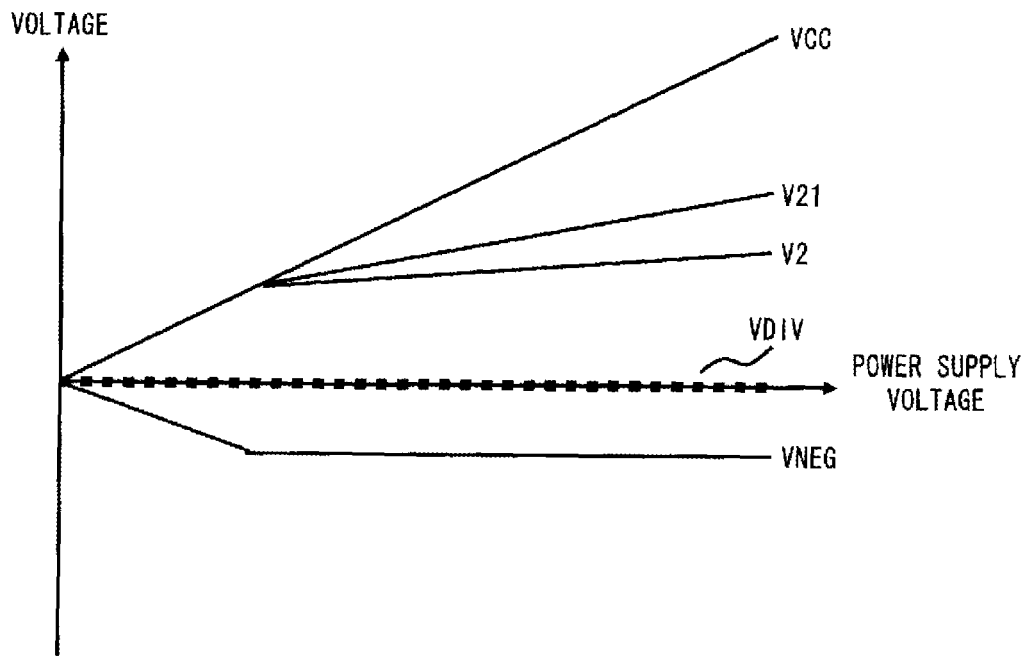
FIG. 10 is a graph showing power supply voltage characteristics of a voltage generator according to the third exemplary embodiment.

FIG. 10 shows a graph of power supply voltage characteristics of the voltage generator in the case where of using the voltage divider 30 according to the third exemplary embodiment. As shown in FIG. 10, the negative voltage VNEG can be maintained constant with use of the voltage divider 30.

As described above, in the voltage divider 30 according to the third exemplary embodiment, it is possible to generate the negative voltage VNEG with high accuracy while maintaining the threshold fluctuation characteristics between the third transistor N3 and the second transistor N2 substantially equal.

Fourth Exemplary Embodiment

Figure 11:
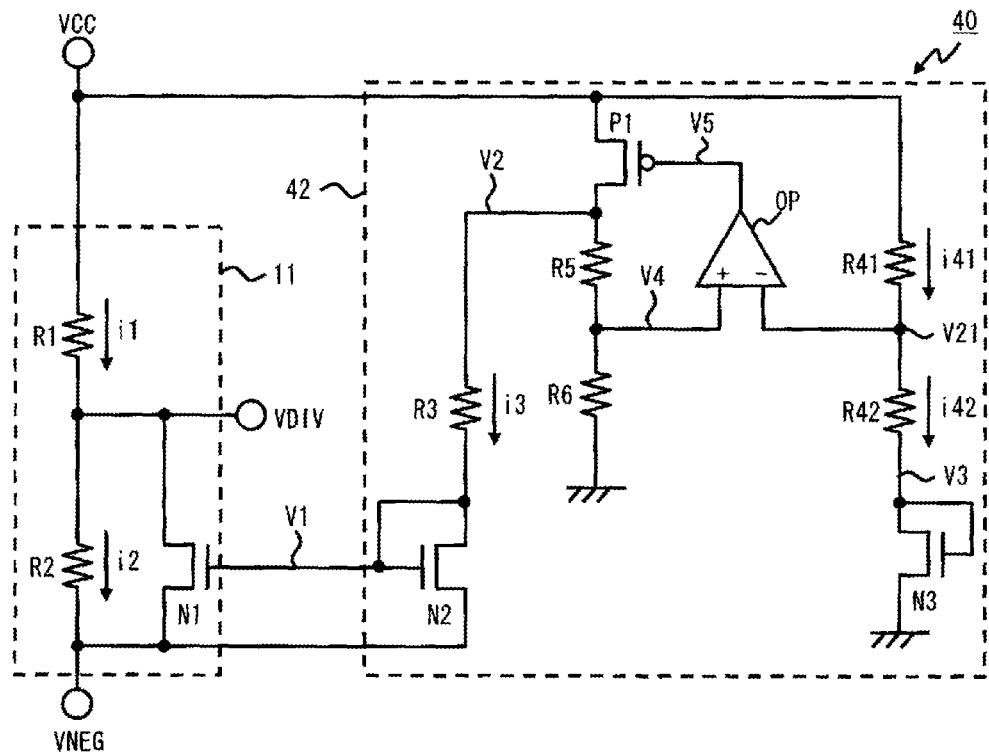
FIG. 11 is a circuit diagram of a voltage divider according to a fourth exemplary embodiment.

A voltage divider 40 in which the resistor R41 and the resistor R42 in the voltage divider 30 according to the third exemplary embodiment are applied to the voltage divider 20 according to the second exemplary embodiment is described hereinafter as a fourth exemplary embodiment. FIG. 11 shows a circuit diagram of the voltage divider 40 according to the fourth exemplary embodiment. Referring to FIG. 11, in a current control circuit 42 of the voltage divider 40, the resistor R41 is used in place of the resistor R4 in the current control circuit 22. Further, in the current control circuit 42, the resistor R42 is placed between the third transistor N3 and the resistor R41. A first power supply detection voltage V21 output from a node between the resistor R41 and the resistor R42 is input to the inverting input terminal of the differential amplifier OP.

Figure 12:
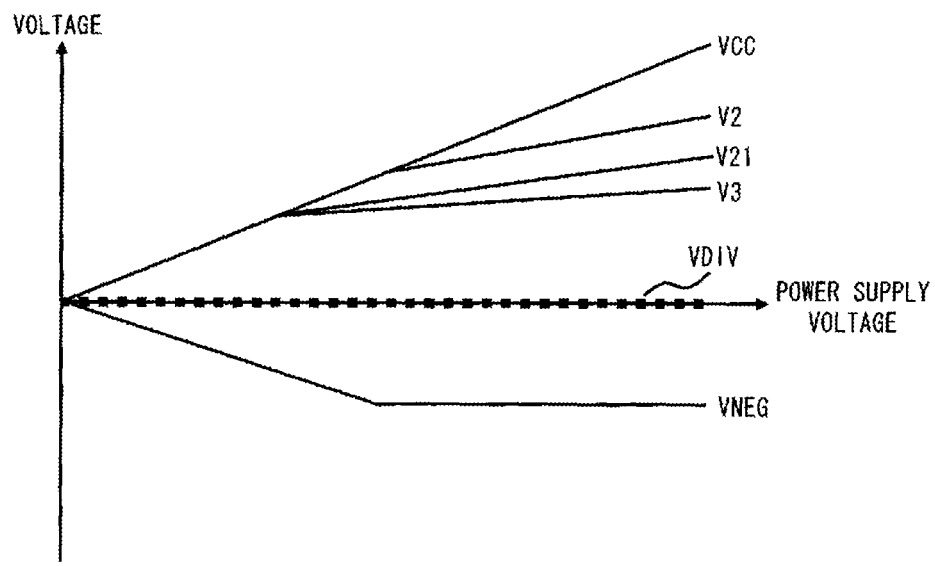
FIG. 12 is a graph showing power supply voltage characteristics of a voltage generator according to the fourth exemplary embodiment.

FIG. 12 shows a graph of power supply voltage characteristics of the voltage generator in the case of using the voltage divider 40. As shown in FIG. 12, the negative voltage VNEG maintains a constant voltage value regardless of the voltage value of the power supply VCC in the voltage generator according to the fourth exemplary embodiment as well.

As described above, in the voltage divider 40, by using the resistor R41 and the resistor R42 of the voltage divider according to the third exemplary embodiment, the negative voltage VNEG with high accuracy can be generated in the current control circuit including the amplifier as well.

Fifth Exemplary Embodiment

Figure 13:
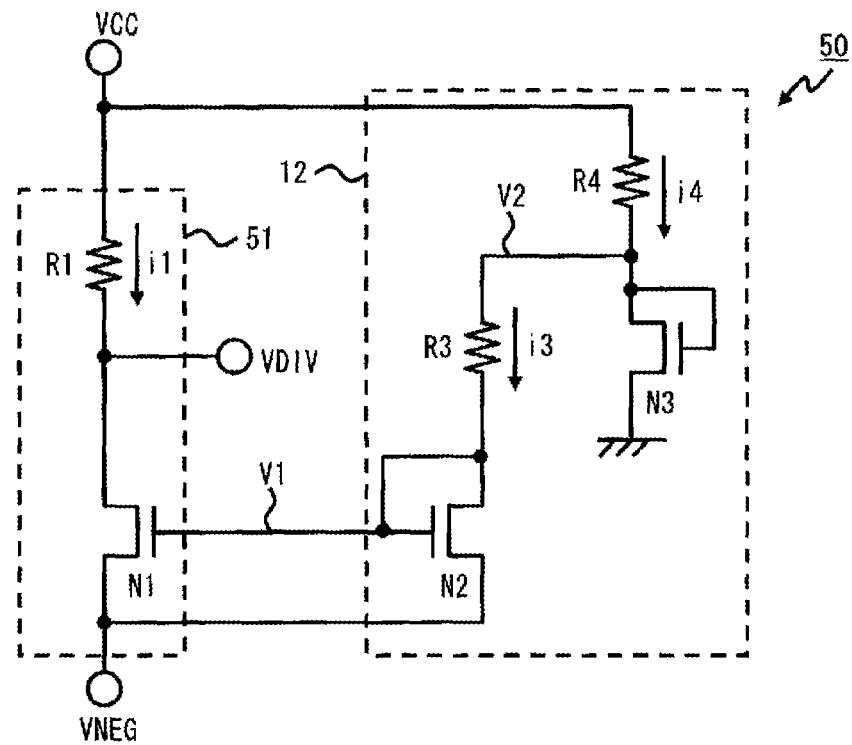
FIG. 13 is a circuit diagram of a voltage divider according to a fifth exemplary embodiment.

FIG. 13 shows a circuit diagram of a voltage divider 50 according to a fifth exemplary embodiment. In the fifth exemplary embodiment, a divided voltage generation circuit 51, which is an alternative example of the divided voltage generation circuit 11 according to the first exemplary embodiment, is described. In the divided voltage generation circuit 51, the resistor R2 of the divided voltage generation circuit 11 is eliminated.

In this manner, even without the resistor R2, the same operation as that of the divided voltage generation circuit 11 can be performed as long as a resistance value equal to that of the resistor R2 can be achieved by the first transistor N1.

Sixth Exemplary Embodiment

Figure 14:
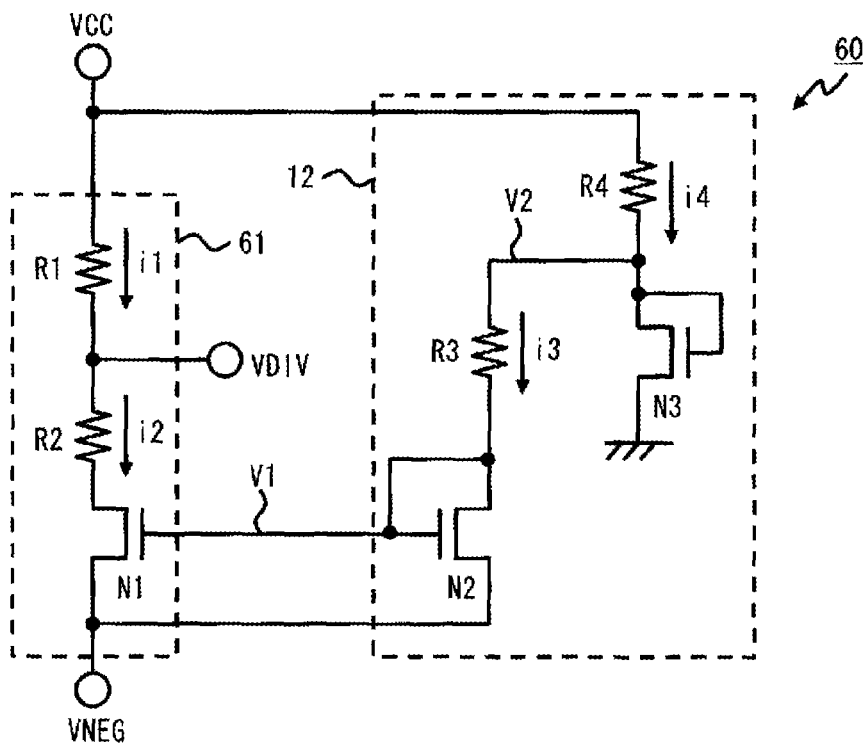
FIG. 14 is a circuit diagram of a voltage divider according to a sixth exemplary embodiment.
Figure 15:
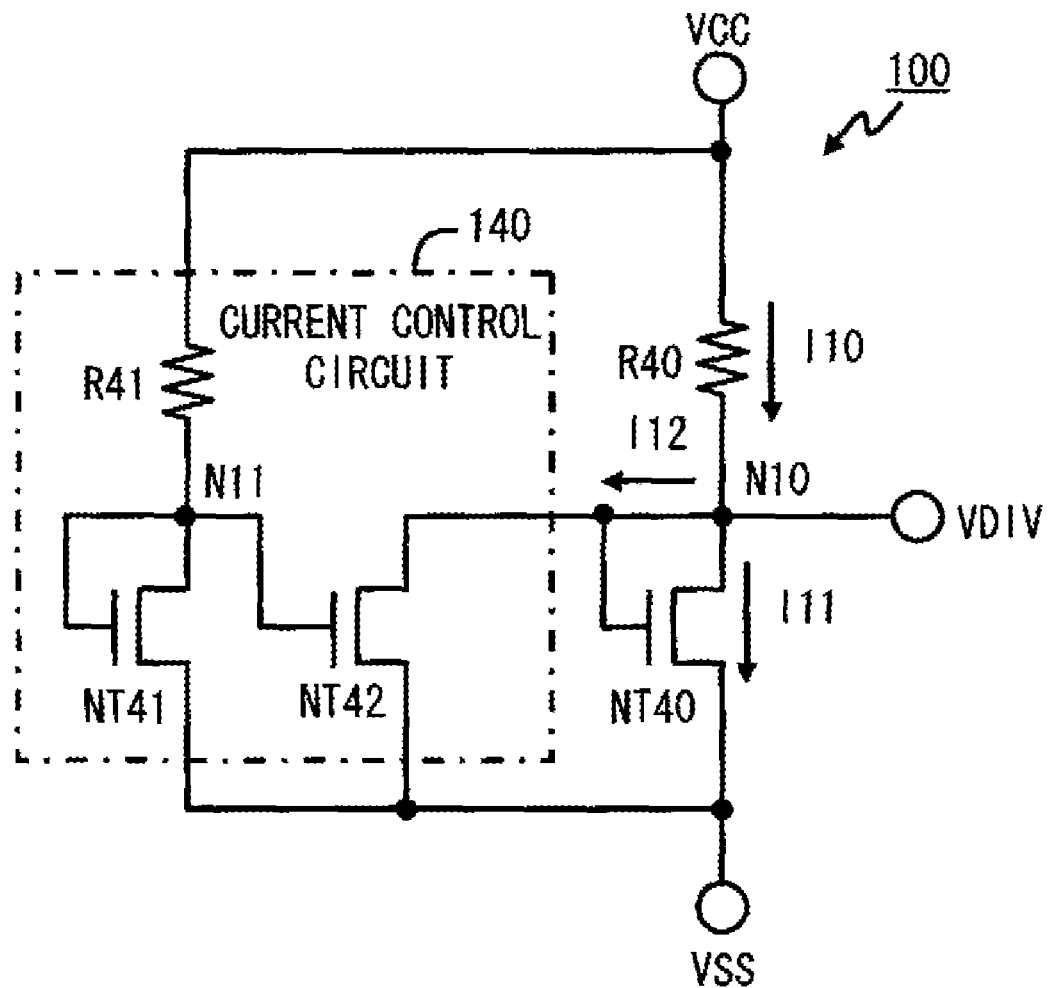
FIG. 15 is a circuit diagram of a bias voltage generator disclosed in Japanese Unexamined Patent Application Publication No. 2003-173213.
Figure 16:
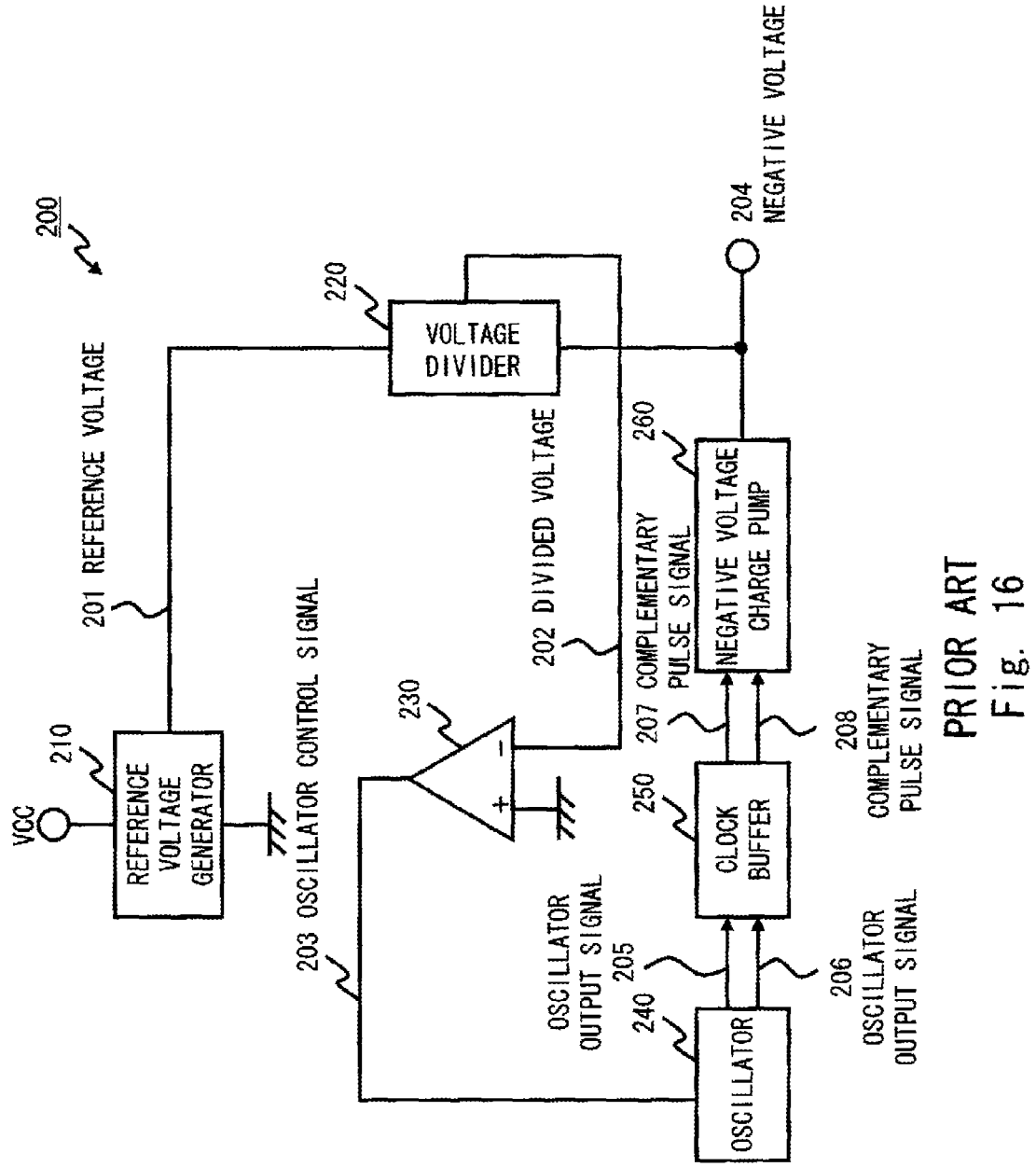
FIG. 16 is a block diagram of a negative voltage generator disclosed in Japanese Unexamined Patent Application Publication No. 11-150230.

FIG. 14 shows a circuit diagram of a voltage divider 60 according to a sixth exemplary embodiment. In the sixth exemplary embodiment, a divided voltage generation circuit 61, which is an alternative example of the divided voltage generation circuit 11 according to the first exemplary embodiment, is described. In the divided voltage generation circuit 61, the first transistor N1 and the resistor R2 of the divided voltage generation circuit 11 are connected in series.

In this manner, in the case where the resistor R2 and the first transistor N1 are connected in series as well, the combined resistance of the first transistor N1 and the resistor R2 can be varied by controlling the first current iN1 flowing to the first transistor N1. Thus, in this case also, the same operation as that of the divided voltage generation circuit 11 can be performed by controlling the first current iN1.

The first to sixth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor apparatus comprising:
    a first voltage node that receives a first voltage;
    a second voltage node that receives a second voltage lower than said first voltage;
    a third voltage node that receives a third voltage higher than said second voltage;
    a voltage generation circuit that outputs a fourth voltage between said first voltage and said second voltage; and
    a control circuit that regulates said fourth voltage, said control circuit being controlled by a voltage swing between said first voltage and said third voltage.

2. The semiconductor apparatus according to claim 1, wherein
    said first voltage comprises a positive voltage,
    said second voltage comprises a negative voltage, and
    said third voltage comprises a ground voltage.

3. The semiconductor apparatus according to claim 1, wherein the control circuit includes:
    a comparator that compares the third voltage with the fourth voltage and switches an oscillator control signal to one of an active state and an inactive state;
    an oscillator that outputs the oscillator output signal during a period in which the oscillator control signal is in the active state; and
    a charge pump circuit that generates the second voltage based on the oscillator output signal.

4. The semiconductor apparatus according to claim 1, wherein the voltage generation circuit includes:
    a divided voltage generation circuit that includes a first resistor element and a first transistor connected in series between the first voltage and the second voltage and generates the fourth voltage by dividing a voltage difference between the first voltage and the second voltage based on a resistance ratio of the first resistor element and the first transistor specified according to a level of a first current flowing to the first transistor; and
    a current control circuit that includes a second transistor that is connected in a mirror configuration to the first transistor and determines the level of the first current by a control current flowing from a first terminal to a second terminal of the second transistor, and increases and decreases the control current according to an increase and decrease in a voltage difference between the first voltage and the third voltage.

5. The semiconductor apparatus according to claim 1, wherein the voltage generation circuit includes:
    a divided voltage generation circuit that includes a first resistor element and a first transistor connected in series between the first voltage and the second voltage and generates the fourth voltage by dividing a voltage difference between the first voltage and the second voltage based on a resistance ratio of the first resistor element and the first transistor specified according to a level of a first current flowing to the first transistor; and
    a current control circuit that includes a second transistor that is connected in a mirror configuration to the first transistor and determines the level of the first current by a control current flowing from a drain terminal to a source terminal of the second transistor, and increases and decreases the control current according to an increase and decrease in a voltage difference between the first voltage and the third voltage, wherein
    the current control circuit includes:
        a circuit that includes a resistor group of at least one resistor element connected in series with a third transistor, the third transistor having a drain terminal and a gate terminal short-circuited connected in series between the first voltage and the third voltage and outputs a power supply detection voltage that increases and decreases according to an increase and decrease in the first voltage from any one of a node between resistors of the resistor group and a node between a resistor of the resistor group and the third transistor; and a third resistor element that is placed between a node outputting the power supply detection voltage and the second transistor and sets a level of the control current, and the second transistor has the source terminal connected to the second voltage and has the drain terminal and a gate terminal short-circuited.

6. The semiconductor apparatus according to claim 1, wherein the voltage generation circuit includes:

a divided voltage generation circuit that includes a first resistor element and a first transistor connected in series between the first voltage and the second voltage and generates the fourth voltage by dividing a voltage difference between the first voltage and the second voltage based on a resistance ratio of the first resistor element and the first transistor specified according to a level of a first current flowing to the first transistor; and a current control circuit that includes a second transistor that is connected in a mirror configuration to the first transistor and determines the level of the first current by a control current flowing from a first terminal to a second terminal of the second transistor, and increases and decreases the control current according to an increase and decrease in a voltage difference between the first voltage and the third voltage wherein the control circuit controls a voltage of the second voltage to a target voltage determined by the voltage of the first voltage and the resistance ratio based on the forth voltage.

7. The semiconductor apparatus according to claim 1, wherein the voltage generation circuit includes:

a divided voltage generation circuit that includes a resistor element and an element with a resistance value varying according to a control current, and outputs the fourth voltage by dividing the first voltage being a positive voltage and the second voltage being a negative voltage; and a current control circuit that outputs the control current to the divided voltage generation circuit based on a voltage difference between the first voltage and the third voltage, wherein the current control circuit reduces variations of the fourth voltage due to variations of the first voltage by increasing the control current when the first voltage rises and decreasing the control current when the first voltage drops.

* * * * *